(12) United States Patent
Byun et al.

(10) Patent No.: US 10,438,531 B2
(45) Date of Patent: Oct. 8, 2019

(54) PROTECTION CIRCUIT AND ORGANIC LIGHT EMITTING DISPLAY DEVICE INCLUDING THE SAME

(71) Applicant: SAMSUNG DISPLAY CO., LTD., Youngin-si, Gyeonggi-do (KR)

(72) Inventors: Min Woo Byun, Yongin-si (KR); Kyoung Jin Park, Yongin-si (KR)

(73) Assignee: Samsung Display Co., Ltd. (KR)

( * ) Notice: Subject to any disclaimer, the term of this patent is extended or adjusted under 35 U.S.C. 154(b) by 245 days.

(21) Appl. No.: 15/227,551

(22) Filed: Aug. 3, 2016

(65) Prior Publication Data

US 2017/0039936 A1  Feb. 9, 2017

(30) Foreign Application Priority Data

Aug. 5, 2015 (KR) .......................... 10-2015-0110761

(51) Int. Cl.
G09G 3/30       (2006.01)
G09G 3/3233     (2016.01)
H01L 27/02      (2006.01)
G09G 3/3208     (2016.01)
G09G 3/3225     (2016.01)

(52) U.S. Cl.
CPC ......... *G09G 3/3233* (2013.01); *G09G 3/3208* (2013.01); *G09G 3/3225* (2013.01); *H01L 27/0266* (2013.01); *G09G 2300/0426* (2013.01); *G09G 2300/0819* (2013.01); *G09G 2310/0262* (2013.01); *G09G 2310/08* (2013.01); *G09G 2330/04* (2013.01)

(58) Field of Classification Search
CPC .... H02H 9/044; G09G 3/3208; G09G 3/3266; G09G 3/3291; H01L 27/3276

USPC ....................... 257/43; 313/504; 345/82, 212
See application file for complete search history.

(56) References Cited

U.S. PATENT DOCUMENTS

| | | | | |
|---|---|---|---|---|
| 2009/0045733 A1* | 2/2009 | Suh | ...................... | H01L 27/3276 313/504 |
| 2010/0238094 A1* | 9/2010 | Cho | ...................... | G09G 3/3208 345/82 |
| 2012/0050251 A1* | 3/2012 | Lee | ...................... | G09G 3/3291 345/212 |
| 2014/0145181 A1* | 5/2014 | Yamazaki | .............. | H02H 9/044 257/43 |
| 2014/0340380 A1* | 11/2014 | Song | ..................... | G09G 3/3266 345/212 |

FOREIGN PATENT DOCUMENTS

KR       10-1478870 B1    1/2015

* cited by examiner

*Primary Examiner* — Abdul-Samad A Adediran
(74) *Attorney, Agent, or Firm* — Innovation Counsel LLP

(57) ABSTRACT

An organic light emitting display device includes a display panel, a pad part positioned at one side of the display panel and having a plurality of pads arranged to receive driving power and driving signals, a plurality of signal input lines arranged to transmit the driving power and the driving signal from the pad part to the display panel, and a protection circuit connected to one or more of the signal input lines, wherein the protection circuit includes a first protection transistor including a gate electrode, a first electrode, and a second electrode, wherein the signal input lines include a first clock signal input line, the first electrode is connected to the first clock signal input signal line, and the second electrode is connected to a first power source.

16 Claims, 3 Drawing Sheets

PROTECTION CIRCUIT AND ORGANIC LIGHT EMITTING DISPLAY DEVICE INCLUDING THE SAME

CROSS-REFERENCE TO RELATED APPLICATION

This application claims priority to, and the benefit of, Korean Patent Application No. 10-2015-0110761 filed on Aug. 5, 2015 in the Korean Intellectual Property Office, the entire contents of which are incorporated herein by reference in their entirety.

BACKGROUND

1. Field

Embodiments of the present invention relate to organic light emitting display devices. More specifically, embodiments of the present invention relate to protection circuits and organic light emitting display devices including the same.

2. Description of the Related Art

An organic light emitting display device displays an image using an organic light emitting diode (OLED) generating light according to hole-electron recombination, which advantageously has a fast response speed and displays a clear image.

In general, an organic light emitting display device includes a plurality of pixels each including a driving transistor and an OLED, and each pixel presents a corresponding gray level by controlling an amount of current supplied to the OLED using a driving transistor.

A display panel of the organic light emitting display device is driven upon receiving driving power and a driving signal transmitted from an external source such as a printed circuit board (PCB).

To this end, a pad part is formed at one side of the display panel to include a plurality of pads that can receive driving power and a driving signal. The pads are connected to a plurality of signal input lines, such that the received driving power and driving signal are transmitted to the pixels of the display panel.

The signal input lines serve to transmit driving power and driving signals from the pad part to the interior of the display panel, and are formed on the display panel to connect the pad part and components of the display panel. For example, the signal input lines may be connected between the pad part and internal components of the display panel such as a display unit, a scan driver, and a data driver.

Here, unintentional electrostatic discharge (ESD), as well as driving power and/or driving signals, may be introduced to the signal input lines, and transmission of ESD to the interior of the display panel through the signal input lines may cause defective driving of the organic light emitting display device.

In addition, when a flexible printed circuit board (FPCB) is misaligned or a larger voltage (e.g. a gate high voltage) flows, an overcurrent may flow to the OLED to burn the organic light emitting display device.

SUMMARY

An embodiment of the present invention relates to a protection circuit capable of lowering the possibility of burning and defective driving, and an organic light emitting display device including the same.

An organic light emitting display device according to an embodiment of the present invention includes: a display panel; a pad part positioned at one side of the display panel and having a plurality of pads arranged to receive driving power and driving signals; a plurality of signal input lines arranged to transmit the driving power and the driving signal from the pad part to the display panel; and a protection circuit connected to one or more of the signal input lines, wherein the protection circuit includes a first protection transistor including a gate electrode, a first electrode, and a second electrode, wherein the signal input lines include a first clock signal input line, the first electrode is connected to the first clock signal input line, and the second electrode is connected to a first power source.

The signal input lines may further include a second clock signal input line, and this second clock signal input line may be connected to the gate electrode of the first protection transistor. A phase difference between a first clock signal applied to the first clock signal input line and a second clock signal applied to the second clock signal input line may be 180 degrees.

The protection circuit may include at least one second protection transistor including a gate electrode, a first electrode, and a second electrode, wherein the gate electrode of the second protection transistor is diode connected to the first electrode of the second protection transistor.

The second protection transistor may be reverse diode connected to the first electrode of the second protection transistor.

At least one second protection transistor may be connected between the first power source and a second power source.

The first power source may be a high potential driving power source, and the second power source may be a low potential driving power source.

The display panel may include: a display unit having pixels; and a driving circuit unit arranged to supply driving signals to the pixels.

The driving circuit unit may include a scan driver arranged to supply scan signals to the scanning lines and to supply emission signals to the emission control lines, and may further include a data driver arranged to supply a data signal to the data lines.

The first clock signal and the second clock signal may be emission control signals for generating the emission signal.

The first clock signal and the second clock signal may be scan control signals for generating the scan signal.

When the first protection transistor is turned on by the second clock signal, a high level voltage of the first clock signal may be supplied to the first power source.

The first power source may be charged with a high level of the first clock signal once every two horizontal periods.

A protection circuit according to another embodiment of the present invention includes: a first protection transistor connected to a first clock signal input line, one of a plurality of signal input lines that are arranged to transmit at least one of driving power and a driving signal from a pad part to a display panel, and a first power source; and a second protection transistor connected between the first clock signal input line and the first power source and electrically connected to the first protection transistor, wherein the first protection transistor includes a gate electrode, a first electrode, and a second electrode, the first electrode is connected to the first clock signal input line and the second electrode is connected to the first power source.

The signal input lines may include a second clock signal input line that is connected to the gate electrode of the first protection transistor, and a phase difference between a first clock signal applied to the first clock signal input line and a second clock signal applied to the second clock signal input line may be 180 degrees.

When the first protection transistor is turned on by the second clock signal, a high level voltage of the first clock signal may be supplied to the first power source.

The second protection transistor may include a gate electrode, a first electrode, and a second electrode, wherein the gate electrode of the second protection transistor is diode connected to the first electrode of the second protection transistor.

According to an embodiment of the present invention, a protection circuit allowing charging a power source (VGH) supply line every two horizontal periods, and the organic light emitting display device including the same, may be provided.

Also, according to an embodiment of the present invention, even though the power source (VGH) line is floated, the OLED may be normally operated.

Also, according to an embodiment of the present invention, the organic light emitting display device may be protected from ESD.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. The various figures are thus not necessarily to scale. It will be understood that when an element is referred to as being "between" two elements, it can be the only element between the two elements, or one or more intervening elements may also be present. Like reference numerals refer to like elements throughout.

DETAILED DESCRIPTION

Figure 1:
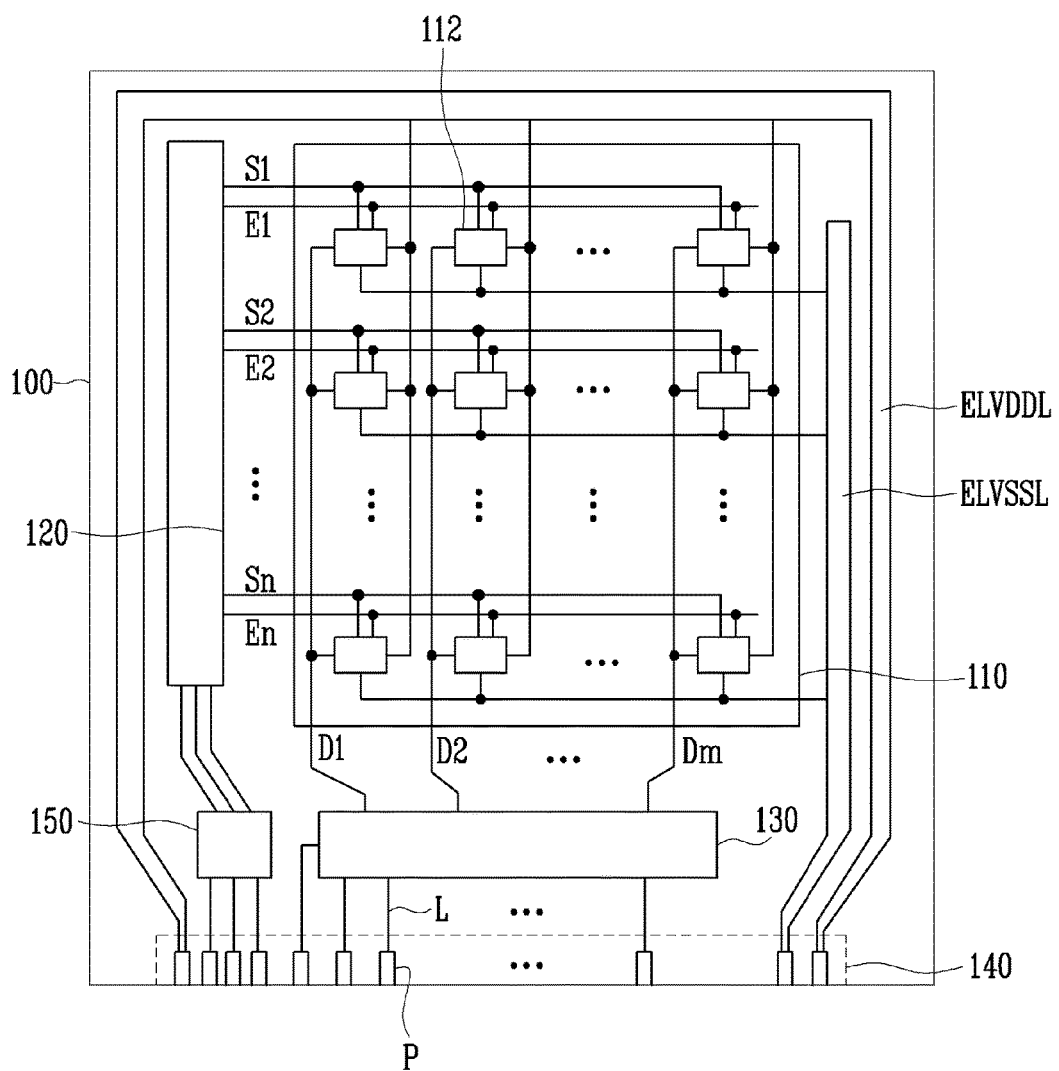
FIG. 1 is a view schematically illustrating a configuration of a display panel of an organic light emitting display device according to an embodiment of the present invention.

Details of embodiments are included in detailed descriptions and drawings.

Advantages and features of the present invention, and implementation methods thereof will be clarified through following embodiments described with reference to the accompanying drawings. The present invention may, however, be embodied in different forms and should not be construed as limited to the embodiments set forth herein. Throughout this specification and the claims that follow, when it is described that an element is "coupled" to another element, the element may be "directly coupled" to the other element or "electrically coupled" to the other element through a third element. In the accompanying drawings, a portion irrelevant to a description of the present invention will be omitted for clarity. Like reference numerals refer to like elements throughout. All numerical values are approximate, and may vary. All examples of specific materials and compositions are to be taken as nonlimiting and exemplary only. Other suitable materials and compositions may be used instead.

Hereinafter, a protection circuit and an organic light emitting display device including the same according to an embodiment of the present invention will be described in detail with reference to the accompanying drawings.

FIG. 1 is a view schematically illustrating a configuration of a display panel of an organic light emitting display device according to an embodiment of the present invention.

Referring to FIG. 1, a display panel 100 of the organic light emitting display device according to an embodiment of the present invention may include a display unit 110, and a driving circuit including a scan driver 120 and a data driver 130. The scan driver 120 and data driver 130 supply driving signals such as a scan signal, an emission signal, and a data signal.

The display unit 110 may include a plurality of pixels 112 positioned in areas defined by intersections of scanning lines S1 to Sn, emission control lines D1 to En, and data lines D1 to Dm.

The display unit 110 may display an image to correspond to a scan signal, an emission signal, and a data signal supplied from the scanning lines S1 to Sn, the emission control lines E1 to En, and the data lines D1 to Dm.

Reference letters EVLDDL and ELVSSL denote lines for a first pixel power source ELVDD and a second pixel power source ELVSS, respectively.

The scan driver 120 may generate a scan signal to correspond to scan driving power and scan signals transmitted from a pad part 140. The scan signal generated by the scan driver 120 is sequentially supplied to the display unit 110 through the scan lines S1 to Sn.

Also, the scan driver 120 may generate emission signals in response to the emission control signals, and sequentially supply the generated emission signals to the emission control lines E1 to En.

In FIG. 1, it is assumed that the scan driver 120 generates both the scan signal and the emission signal, but the present invention is not limited thereto and, for example, a separate driver for generating the emission signal may instead be provided.

Next, the data driver 130 may generate data signals to correspond to data and data control signals transmitted from the pad part 140.

The data signals generated by the data driver 130 may be synchronized with scan signals and supplied to the display unit 110 through the data lines D1 to Dm.

The pad part 140 is formed to be positioned at one side of the display panel 100, and may include a plurality of pads P receiving driving power and driving signals from an external source.

Here, the pad part 140 may be connected to a plurality of signal input lines L such that driving power and driving signals may be transmitted from an external source to the interior of the display panel 100.

That is, each of the pads P may be connected to a component within the display panel 100 through each of the signal input lines L. For example, each of the pads P may be connected to at least any one of the elements of the display panel 100, such as elements 110, 130 or 150, through each of the signal input lines L.

The signal input lines L may be formed on the display panel 100 such that they are connected between the pad part 140 and a component within the display panel 100, and function to transmit driving power and driving signals from the pad part 140 to the interior of the display panel 100.

For example, the signal input lines L may be connected between the pad part 140 and any of the display unit 110, the scan driver 120, and the data driver 130, to transmit driving power and driving signals from the pad part 140 to the scan driver 120 and the data driver 130.

Here, in embodiments of the present invention, a protection circuit 150 may be connected to an input side of one or more of the signal input lines L. That is, the protection circuit 150 may be connected to one or more signal input lines L that are connected between the pad part 140 at one end, and another element of the display panel 100 at the other.

For example, as illustrated in FIG. 1, the protection circuit 150 may be connected to signal input lines L that are connected between the scan driver 120 and the pad part 140. In this case, the protection circuit 150 may be formed to be connected to the signal input lines L supplying scan driving power and/or scan control signals (for example, a start pulse, a clock signal, and an output enable signal of the scan driver 120).

Figure 2:
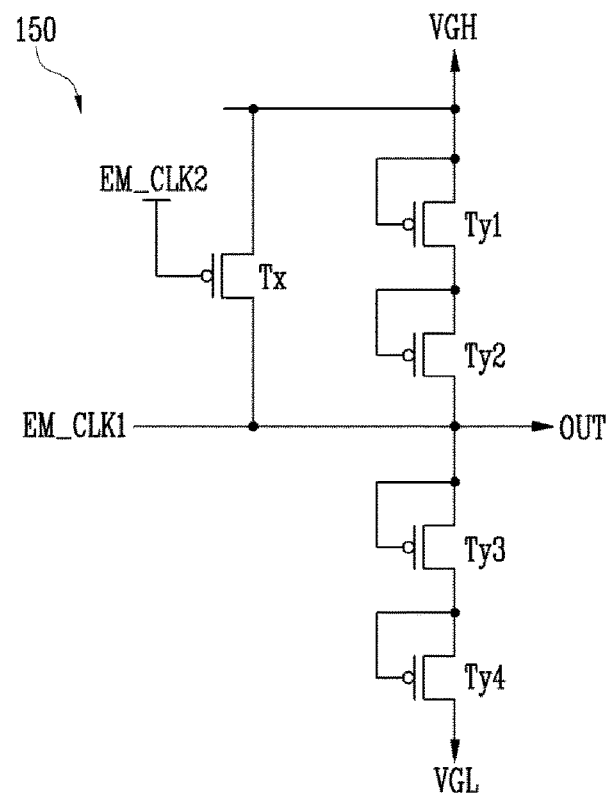
FIG. 2 is a circuit diagram illustrating an embodiment of a protection circuit illustrated in FIG. 1.

FIG. 2 is a circuit diagram illustrating an embodiment of a protection circuit illustrated in FIG. 1.

Referring to FIG. 2, the protection circuit 150 may include a first protection transistor Tx and second protection transistors Ty1 to Ty4.

The first protection transistor Tx may include a first electrode and a second electrode, and may be connected to any one of a plurality of signal input lines L extending from the pad part 140.

For example, an input line supplying a first clock signal EM_CLK1 may be one of the signal input lines L, and is connected to a first electrode of the first protection transistor Tx. A first power source VGH may be connected to a second electrode of the first protection transistor Tx.

Also, an input line supplying a second clock signal EM_CLK2 may be another one of the signal input lines L, and may be connected to a gate electrode of the first protection transistor Tx.

The first protection transistor Tx may be turned on or turned off by the second clock signal EM_CLK2.

When the first protection transistor Tx is turned on by the second clock signal EM_CLK2, a voltage corresponding to the first clock signal EM_CLK1 may be applied to the first power source VGH.

Here, the first clock signal EM_CLK1 and the second clock signal EM_CLK2 may be part of an emission control signal for generating an emission signal, and a phase difference between the first clock signal EM_CLK1 and the second clock signal EM_CLK2 may be 180 degrees.

Figure 3:
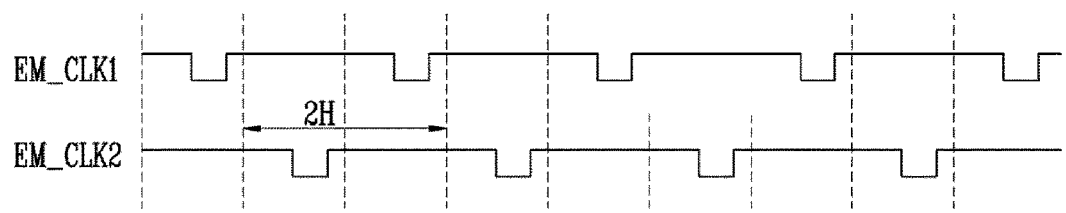
FIG. 3 is a waveform view of a signal input to the protection circuit according to an embodiment of the present invention.

FIG. 3 is a waveform view of a signal input to the protection circuit according to an embodiment of the present invention.

Referring to FIG. 3, the first clock signal EM_CLK1 and the second clock signal EM_CLK2 may be supplied through different signal input lines L.

Here, as illustrated in FIG. 3, the first clock signal EM_CLK1 and the second clock signal EM_CLK2 may have a phase difference of 180 degrees. That is, pulses of the first clock signal EM_CLK1 and the second clock signal EM_CLK2 may be applied once at every two horizontal periods 2H, and may be alternately applied by horizontal period.

Since the first clock signal EM_CLK1 and the second clock signal EM_CLK2 have opposite phases, when the second clock signal EM_CLK2 has a low level, the first clock signal may have a high level.

When a pulse is applied to the second clock signal EM_CLK2, the first protection transistor Tx may be turned on, and at this time, since the first clock signal EM_CLK1 has a high level, a high level voltage may be applied to the first power source VGH.

That is, since a line of the first power source VGH floats, even when a sufficiently high level voltage is not supplied to the first power source VGH, a level of the first power source VGH may be increased to a high level whenever a pulse of the second clock signal EM_CLK2 is applied to the gate electrode of the first protection transistor Tx.

Meanwhile, in FIGS. 2 and 3, it is assumed that the first clock signal EM_CLK1 and the second clock signal EM_CLK2 applied to the first electrode and the gate electrode of the first protection transistor Tx are part of the emission control signal, but the present invention is not limited thereto.

That is, any two signals transmitted from the pad part 140 and having opposite phases may be used as the first clock signal EM_CLK1 and the second clock signal EM_CLK2.

For example, a scan control signal may be applied as a first clock signal and a second clock signal to the first electrode and the gate electrode of the first protection transistor Tx.

Next, the second protection transistors Ty1, Ty2, Ty3, and Ty4 may be transistors each including a gate electrode, a first electrode, and a second electrode, where each gate electrode is connected to its respective first electrode in a diode form. In particular, the second protection transistors Ty1, Ty2, Ty3, and Ty4 may be configured as transistors diode-connected in a reverse direction.

Also, as a first power source and a second power source for driving the second protection transistors Ty1, Ty2, Ty3, and Ty4, the first power source VGH, a high potential driving power source, and a second power source VGL as a low potential driving power source, may be used, or a separate power source may be used.

The transistors are connected in a reverse diode form based on a case in which driving power and a driving signal are input. When positive ESD or negative ESD having a large absolute value is input, a connection direction of the diodes may be a forward direction for the ESD.

That is, among ESDs having a high magnitude of a voltage (that is, an absolute value of a voltage), ESD having a positive (+) value is induced toward the first power source VGH and ESD having a negative (−) value is induced toward the second power source VGL, so that ESD may not be input to other components formed within the display panel 100.

Meanwhile, when general driving power or a driving signal is applied, the driving power or the driving signal input to the protection circuit 150 may be output unchanged through an output line OUT, without being bypassed toward the first power source VGH or the second power source VGL.

As illustrated in FIG. 2, the second protection transistors Ty1, Ty2, Ty3, and Ty4 may be provided between the first power source VGH and the output line OUT, and between the second power source VGL and the output line OUT.

Meanwhile, the second protection transistors Ty1, Ty2, Ty3, and Ty4 may all be the same type of transistors, for example, P-type transistors, as illustrated in FIG. 2, or may be formed as different types of transistors, for example, P-type and N-type transistors. That is, the second protection transistors Ty1, Ty2, Ty3, and Ty4 may be any types of transistors.

Also, although not shown, the protection circuit 150 may further include a resistor element.

As described above, when the protection circuit 150 including the second protection transistors Ty1, Ty2, Ty3, and Ty4 in the form of diodes is connected to the signal input lines L connecting the pad part 140, ESD introduced to the signal input lines L may be bypassed toward the first power source VGH or the second power source VGL by the second protection transistors Ty1, Ty2, Ty3, and Ty4.

Thus, damage to the components within the display panel 100 due to ESD may be prevented, and thus, defective driving of the organic light emitting display device may be prevented.

Figure 4:
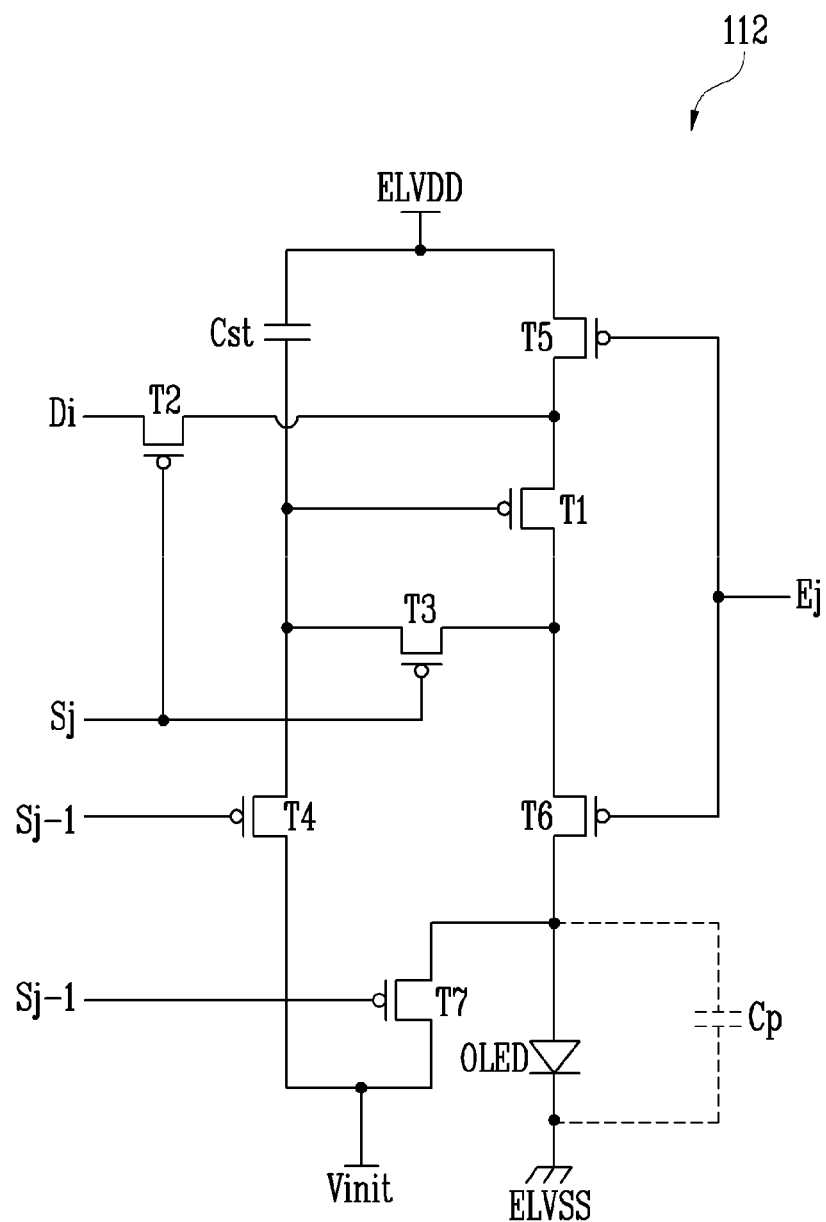
FIG. 4 is a circuit diagram illustrating a pixel of an organic light emitting display device according to an embodiment of the present invention.

FIG. 4 is a circuit diagram illustrating a pixel of an organic light emitting display device according to an embodiment of the present invention.

Referring to FIG. 4, a pixel 112 according to an embodiment of the present invention may include a first transistor T1, a second transistor T2, a third transistor T3, a fourth transistor T4, a fifth transistor T5, a sixth transistor T6, a seventh transistor T7, a capacitor Cst, and an OLED.

The first transistor T1 may be provided between the first pixel power source ELVDD and the OLED, and serves as a driving transistor supplying a driving current to the OLED.

The second transistor T2 may be connected between a first electrode of the first transistor T1 and a data line D1. When the second transistor T2 is turned on by a scan signal supplied to a jth scanning line Sj, a data signal from the ith data line Di may be transmitted to a node connecting the first transistor T1 and the fifth transistor T5.

The third transistor T3 may be connected to a second electrode of the first transistor T1, and may be turned on or turned off by a scan signal supplied to the jth scanning line Sj. The fourth transistor T4 may be provided between the capacitor Cst and the second pixel power source ELVSS, and may be turned on or turned off by a scan signal supplied to an (j−1)th scanning line Sj−1.

The fifth transistor T5 may be provided between the first pixel power source ELVDD and the first transistor T1. The sixth transistor T6 may be provided between the first transistor T1 and the OLED, and may be turned on or turned off by an emission signal supplied to the jth emission control line Ej to control emission of the OLED.

The seventh transistor T7 may be connected between an initialization power source Vinit and an anode electrode of the OLED, and when an emission period of the OLED is terminated, the seventh transistor T7 may perform a function of initializing the anode electrode of the OLED.

The OLED may be connected between the sixth transistor T6 and the second pixel power source ELVSS.

The OLED may receive a driving current from the first transistor T1, and emit light with brightness corresponding to the driving current.

Also, as illustrated beside the LED, a parasitic capacitor Cp may be present in the OLED.

After the organic light emitting display device of embodiments of the invention is manufactured, a step of artificially degrading certain of its elements to a predetermined level through aging may be performed. Such aging may be performed in order to reduce initial defects and enhance lifespan of the display device.

Here, when aging is performed on the first transistor T1, if the line of the first power source VGH is floated so a sufficiently high voltage is not applied to the first power source VGH, a voltage applied to the gate electrode of the first transistor T1 is lowered, and thus, an overcurrent may flow to the LED.

That is, the OLED is burned to increase a probability in which reliability is defective even in a normal driving, not in a driving for performing aging.

According to the present invention, even though the foregoing problem arises, since the level of the first power source VGH is raised for charging once in every two horizontal periods (2H), the phenomenon in which the OLED is burned may be reduced.

That is, even though the first power source VGH is floated, burning occurrence probability and defective driving probability may be reduced.

The first power source VGH and the second power source VGL correspond to a high level voltage and a low level voltage supplied to a predetermined driving unit (for example, the scan driving unit). In the case that aging is performed on the first transistor T1 when the first power source VGH is not normally applied to the scan driving unit, the first and second transistors T2 and T3 may not normally operate since a high level signal of the scan signal Sj is not properly supplied. Accordingly, the OLED may be burned caused by the over-current flowing thereon or the possibility of defect may increase although the transistor T1 normally operates.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims. Various features of the above described and other embodiments can be mixed and matched in any manner, to produce further embodiments consistent with the invention.

What is claimed is:

1. An organic light emitting display device comprising:
   a display panel;
   a pad part positioned at one side of the display panel and having a plurality of pads arranged to receive driving power and driving signals;
   a plurality of signal input lines arranged to transmit the driving power and the driving signals from the pad part to the display panel; and
   a protection circuit connected to the plurality of signal input lines,
   wherein the protection circuit comprises a first protection transistor including a gate electrode, a first electrode, and a second electrode,
   wherein the gate electrode is electrically isolated from each of the first electrode and the second electrode, not electrically connected to the first electrode and not electrically connected to the second electrode,
   wherein the plurality of signal input lines includes a first clock signal input line and a second clock signal input line,
   wherein the first electrode is electrically connected to the first clock signal input line, wherein the gate electrode is electrically connected to the second clock signal input line, and wherein the second electrode is electrically connected to a first power source.

2. The organic light emitting display device of claim 1, wherein a phase difference between a first clock signal applied to the first clock signal input line and a second clock signal applied to the second clock signal input line is 180 degrees.

3. The organic light emitting display device of claim 1, wherein the protection circuit comprises a second protection transistor including a gate electrode, a first electrode, and a second electrode, and wherein the gate electrode of the second protection transistor is diode connected to the first electrode of the second protection transistor.

4. The organic light emitting display device of claim 1, wherein the protection circuit comprises a second protection transistor including a gate electrode, a first electrode, and a second electrode, and wherein the gate electrode of the second protection transistor is reverse diode connected to the first electrode of the second protection transistor.

5. The organic light emitting display device of claim 1, wherein the protection circuit comprises at least one second protection transistor, and wherein the at least one second protection transistor is connected between the first power source and a second power source.

6. The organic light emitting display device of claim 5, wherein the first power source is a high potential driving power source and the second power source is a low potential driving power source.

7. The organic light emitting display device of claim 2, wherein the display panel comprises:

a display unit having pixels;
scanning lines electrically connected to the pixels;
emission control lines electrically connected to the pixels;
data lines electrically connected to the pixels; and
a driving circuit unit arranged to supply driving signals to the pixels.

8. The organic light emitting display device of claim 7, wherein the driving circuit unit comprises a scan driver arranged to supply scan signals to the scanning lines and to supply emission signals to the emission control lines, and further comprises a data driver arranged to supply a data signal to the data lines.

9. The organic light emitting display device of claim 8, wherein the first clock signal and the second clock signal are emission control signals configured to generate the emission signal.

10. The organic light emitting display device of claim 8, wherein the first clock signal and the second clock signal are scan control signals configured to generate the scan signal.

11. The organic light emitting display device of claim 2, wherein, when the first protection transistor is turned on by the second clock signal, a high level voltage of the first clock signal is supplied to the first power source.

12. The organic light emitting display device of claim 11, wherein the first power source is charged with a high level of the first clock signal once every two horizontal periods.

13. A protection circuit comprising:

a first protection transistor connected to a first clock signal input line, one of a plurality of signal input lines that are arranged to transmit at least one of driving power and a driving signal from a pad part to a display panel, and a first power source; and a second protection transistor connected between the first clock signal input line and the first power source and electrically connected to the first protection transistor, wherein the first protection transistor comprises a gate electrode, a first electrode, and a second electrode, wherein the gate electrode is electrically isolated from each of the first electrode and the second electrode, not electrically connected to the first electrode and not electrically connected to the second electrode, wherein the plurality of signal input lines includes a second clock signal input line, wherein the first electrode is electrically connected to the first clock signal input line, wherein the gate electrode is electrically connected to the second clock signal input line, and wherein the second electrode is electrically connected to the first power source.

14. The protection circuit of claim 13, wherein a phase difference between a first clock signal applied to the first clock signal input line and a second clock signal applied to the second clock signal input line is 180 degrees.

15. The protection circuit of claim 14, wherein when the first protection transistor is turned on by the second clock signal, a high level voltage of the first clock signal is supplied to the first power source.

16. The protection circuit of claim 13, wherein the second protection transistor comprises a gate electrode, a first electrode, and a second electrode, and wherein the gate electrode of the second protection transistor is diode connected to the first electrode of the second protection transistor.

* * * * *